(12) United States Patent
Choi et al.

(10) Patent No.: US 6,603,212 B2
(45) Date of Patent: Aug. 5, 2003

(54) LASER DIODE USING REFLECTIVE LAYER INCLUDING AIR LAYER AND METHOD FOR FABRICATING THE SAME

(75) Inventors: Kwang-ki Choi, Kyungki-do (KR); Jae-hee Cho, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 10/152,037

(22) Filed: May 22, 2002

(65) Prior Publication Data

US 2002/0175336 A1 Nov. 28, 2002

(30) Foreign Application Priority Data

May 22, 2001 (KR) ........................................ 2001-28089

(51) Int. Cl.[7] .............................................. H01L 23/544
(52) U.S. Cl. ......................................... 257/797; 257/98
(58) Field of Search ...................... 257/797, 98; 372/32

(56) References Cited

U.S. PATENT DOCUMENTS 6,320,888 B1 * 11/2001 Tanaka et al.
6,501,188 B1 * 12/2002 Stanton et al.
6,504,180 B1 * 1/2003 Heremans et al.
6,507,595 B1 * 1/2003 Kapon et al.

* cited by examiner

Primary Examiner—Stephen D. Meier
(74) Attorney, Agent, or Firm—Burns, Doane, Swecker & Mathis, L.L.P.

(57) ABSTRACT

A laser diode that uses air as a reflective layer, thereby enhancing reflectance with respect to an oscillating laser beam, and a method for fabricating such a laser diode are provided. The laser diode includes a substrate, a laser oscillating layer formed on the substrate, an upper electrode formed on the laser oscillating layer, and a reflective layer formed at one side of the laser oscillating layer, wherein the reflective layer comprises air layers. According to the laser diode and the method for fabricating the same, it is possible to form a reflective layer having a higher reflectivity with a reduced number of pairs of reflective layers, thereby making a laser diode whose threshold voltage is reduced and which can produce a high-output laser beam.

4 Claims, 6 Drawing Sheets

LASER DIODE USING REFLECTIVE LAYER INCLUDING AIR LAYER AND METHOD FOR FABRICATING THE SAME

Priority is claimed to patent application Ser. No. 2001-28089 filed in Rep. of Korea on May 22, 2001, herein incorporated by reference.

BACKGROUND OF THE INVENTION

1. Field of the Invention

The present invention relates to a laser diode and a method for fabricating the same, and more particularly, to a laser diode that uses air as a reflective layer, thereby enhancing reflectance with respect to an oscillating laser beam, and a method for fabricating such a laser diode.

2. Description of the Related Art

In general, a semiconductor laser diode is a structure in which a buffer layer, a laser oscillating layer that is composed of a buffer layer, a lower clad layer, an active layer and an upper clad layer, and a cap layer and an upper electrode are sequentially stacked. Also, a lower electrode is formed below the semiconductor substrate.

When a predetermined voltage is applied across the upper electrode and the lower electrode, an electromagnetic wave of predetermined wavelength, which is generated in the active layer and oscillates between the both sides of the laser oscillating layer, is emitted out of a side of the laser oscillating layer. This is an edge emitting laser diode. Laser diodes have various uses, but have been mainly used in optical pickups for writing and reading data on a writing medium such as digital versatile discs (DVDs).

It is required that a mirror layer with a high reflectance be attached to a side of the laser oscillating layer so as to generate a high-output laser beam. The mirror layer is obtained by coating a thin layer that has a high reflectance on one side of the laser oscillating layer. Today, there is a lot of ongoing research into the formation of such a thin layer.

In the past, as can be seen in FIG. 1, a reflective layer 15 was obtained by alternatively depositing first and second dielectric layers 13 and 14 which have different refractive indexes several times on a side of a laser oscillating layer 12 from which laser light is emitted, thereby making a laser diode whose threshold voltage is reduced and which can produce a high-output laser beam. Here, the thickness of each of the first and second dielectric layers 13 and 14 is calculated by $\lambda/(4n)$, wherein $\lambda$ denotes the wavelength of laser beam emitted from the laser oscillating layer 12, and n denotes the refractive index of each dielectric layer with respect to the wavelength of laser beam emitted. In general, the greater the difference between the refractive indexes of two dielectric layers, and the greater the number of layers deposited are, the greater the reflectance is. Here, the dielectric layers 13 and 14 are alternately deposited several times to form several pairs of the dielectric layers 13 and 14.

It is possible to select various dielectric materials for the dielectric layers 13 and 14 which make up the reflective layer 15, according to the wavelength of laser beam emitted from the laser oscillating layer 12. Preferably, the dielectric layers are formed of $SiO_2$ and $TiO_2$ because the difference between their refractive indexes is greater than any two other dielectric materials. Once dielectric materials are selected, the first dielectric layer 13 is formed, and then second dielectric layer 14 whose refractive index is larger than that of the first dielectric layer 13 is formed. If these dielectric layers 13 and 14 are formed of $SiO_2$ and $TiO_2$, the difference between their refractive indexes is about 1.35 with respect to a laser wavelength of 410 nm. To give the reflective layer 15 a high reflectance, e.g., 90% or more, it must be made of at least three pairs of the first and second dielectric layers 13 and 14. Therefore, for high reflectance, the number of pairs of the dielectric layers 13 and 14 must be greater than a predetermined number. However, as the number of pairs of the dielectric layers 13 and 14 increases, it takes more time to form and etch them to make a thin layer.

Hereinafter, a conventional reflective layer and its manufacturing process will be described with reference to FIGS. 2A through 2C. Referring to FIG. 2A, a laser oscillating layer 22 from which a laser beam is emitted is deposited on a semiconductor substrate 21, and then, two dielectric materials are alternatively deposited to form dielectric layers 23 and 24 that together make up a reflective layer 25. When the dielectric layers 23 and 24 are formed, a dielectric material whose refractive index is comparatively low is first deposited, and then a dielectric material whose refractive index is relatively high is later deposited. The dielectric layers 23 and 24 are alternately deposited several times to form a desired number of pairs thereof.

As described above, in order to obtain a reflectance of 90%, at least three pairs of the dielectric layers 23 and 24 must be deposited, even if they are formed of $SiO_2$ and $TiO_2$ which have a greater difference in refractive index than any two other materials, as shown in FIG. 2B. During this process, several pairs of the dielectric layers 23 and 24 are deposited on a portion of the semiconductor substrate 21 as well as a side of the laser oscillating layer 22 from which a laser beam is emitted. Thereafter, a portion of the several pairs of the dielectric layers 23 and 24 formed on an upper electrode 26 must be removed to connect the upper electrode 26 with the outer electrode as shown in FIG. 2C. This is because the dielectric layers 23 and 24 are non-conductive layers that block the flow of current. Accordingly, a conventional laser diode is disadvantageous in that it takes a lot of time to deposit and etch the dielectric layers 23 and 24, especially, when there are many pairs of the dielectric layers 23 and 24.

SUMMARY OF THE INVENTION

To solve the above problem, it is a first object of the present invention to provide a laser diode in which the number of pairs of dielectric layers is reduced due to an air layer formed on a dielectric layer with a low refractive index, and a reflective layer of higher reflectance is formed, thereby giving the laser diode a reduced threshold voltage and a high output.

It is a second object of the present invention to provide a method for fabricating such a laser diode.

To achieve the first object, there is provided a laser diode including a substrate, a laser oscillating layer formed on the substrate, an upper electrode formed on the laser oscillating layer, and a reflective layer formed at one side of the laser oscillating layer, wherein the reflective layer comprises air layers.

Preferably, the reflective layer has a structure in which an air layer and a dielectric layer are alternately deposited several times and is made of at least two pairs of an air layer and a dielectric layer.

Preferably, the dielectric layers include a $TiO_2$ layer.

To achieve the second object, there is provided a method of fabricating a laser diode including the steps of: (a) forming a laser oscillating layer on a substrate, and then, forming an upper electrode on the laser oscillating layer; (b)

forming sacrificial layers and dielectric layers alternately at one side of the laser oscillating layer; and (c) etching the sacrificial layers selectively.

Preferably, during step (b) the sacrificial layers and the dielectric layers are alternately deposited to form two pairs of these layers.

Preferably, during step (b), the sacrificial layers and the dielectric layers are formed by sputtering.

Preferably, this method further includes removing the sacrificial layers and the dielectric layers from the upper electrode after the step (b), and the sacrificial layers and the dielectric layers are removed from the upper electrode by RIE.

Preferably, during step (c), the sacrificial layers are selectively etched by wet etching, using a buffered oxide etchant (BOE).

BRIEF DESCRIPTION OF THE DRAWINGS

The above objects and advantages of the present invention will become more apparent by describing in detail preferred embodiments thereof with reference to the attached drawings in which:

FIG. 5A is an SEM photograph of a laser diode in which a sacrificial $SiO_2$ layer and a dielectric $TiO_2$ layer are formed on a semiconductor substrate and a side of a laser oscillating layer. FIG. 5B is an SEM photograph of the laser diode of FIG. 5A in which the sacrificial layer is selectively etched.

DETAILED DESCRIPTION OF THE INVENTION

Figure 1:
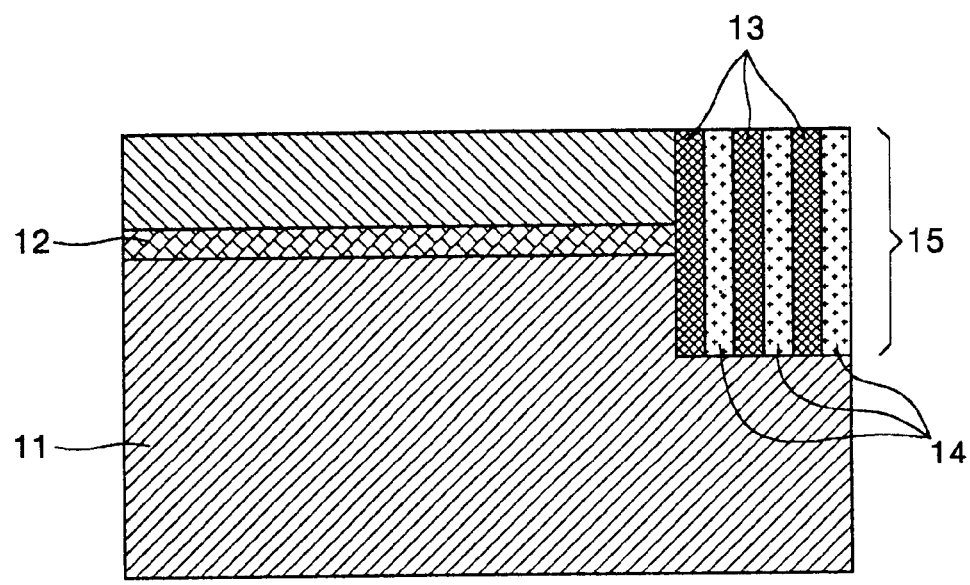
FIG. 1 is a cross-sectional view of a conventional laser diode.
Figure 2A:
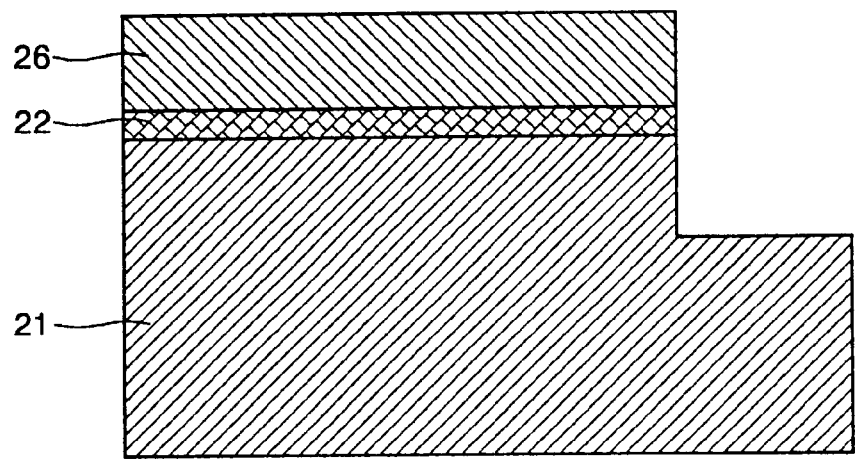
FIGS. 2A through 2C are cross-sectional views for explaining a method for fabricating a reflective layer of a conventional laser diode.
Figure 2B:
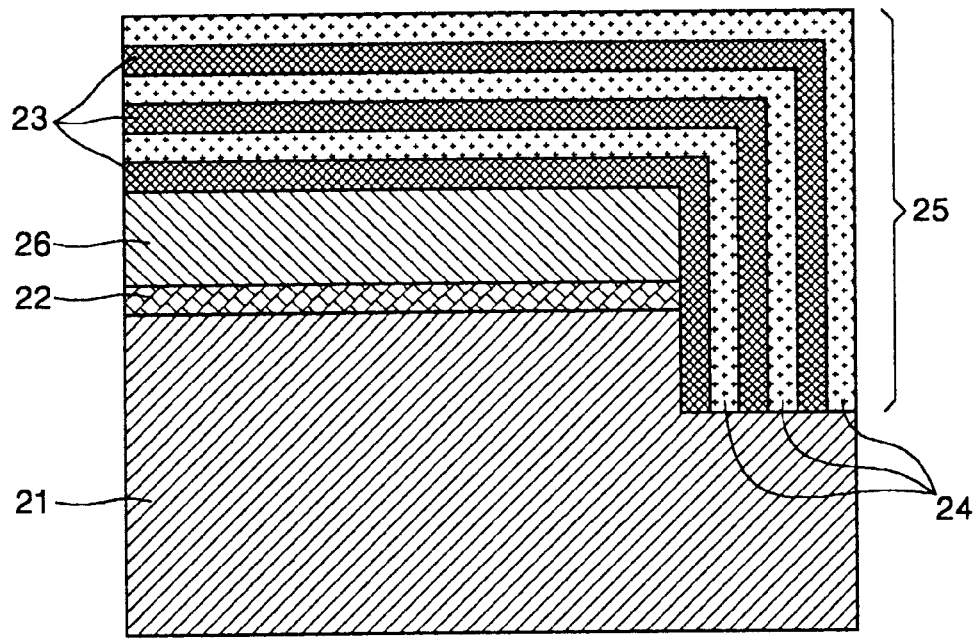
Figure 2C:
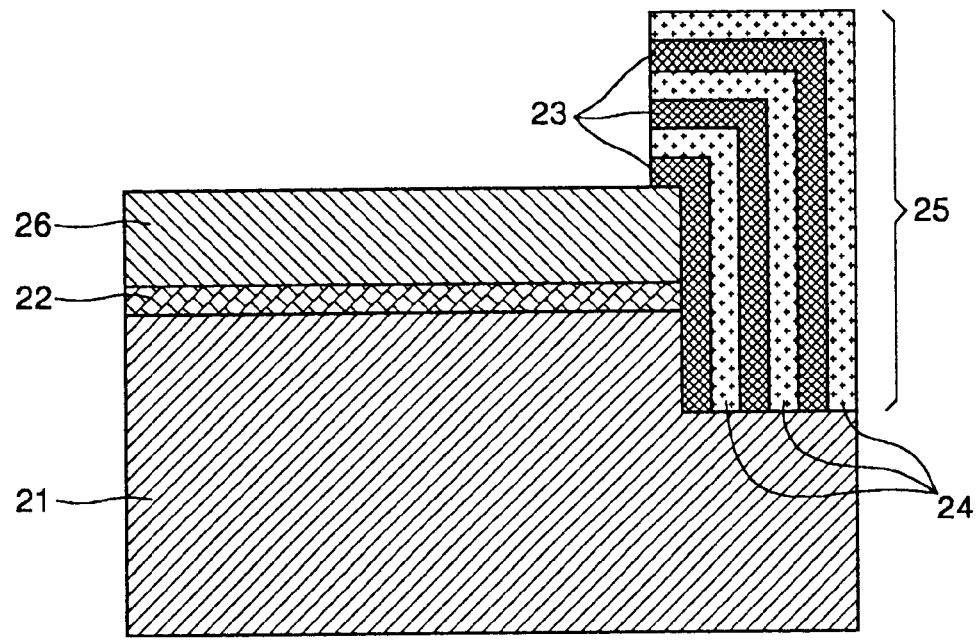
Figure 3:
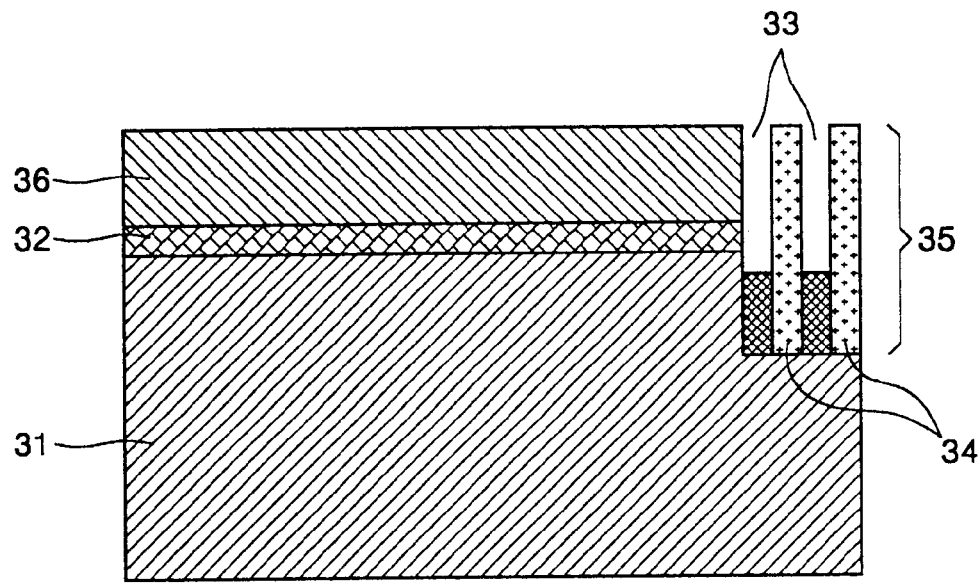
FIG. 3 is a cross-sectional view of a laser diode according to the present invention.

Hereinafter, the structure of a laser diode that uses a reflective layer including an air layer will now be explained with reference to FIG. 3. Referring to FIG. 3, a laser oscillating layer 32 is formed on a semiconductor substrate 31. A reflective layer 35, which is made by alternatively depositing an air layer 33 and a dielectric layer 34 several times, is formed on a side of the laser oscillating layer 32. The laser oscillating layer 32 has a structure in which a lower clad layer, an active layer and an upper clad layer are sequentially deposited. Here, the reflective layer 35 can be also applied to an edge emitting laser diode.

In the laser diode, a laser beam of a predetermined wavelength, which is generated in a laser oscillating layer, causes constructive interference while oscillating between both sides of a laser oscillating layer. As a result, the laser beam has predetermined energy, and then is emitted out of a side of the laser oscillating layer. The reflective surface of one side of the laser oscillating layer and the opposite side from which the laser beam is emitted, is formed to have a reflectance of 90% or more with respect to the laser beam.

The reflective layer with this reflective surface is made by depositing several pairs of dielectric layers of two different materials. At this time, preferably, the difference between the refractive indexes of the two different dielectric materials is larger and the reflective layer is composed of several pairs of the dielectric layers.

The reflective layer of a conventional laser diode is usually formed of dielectric materials such as $SiO_2$, $TiO_2$, $Al_2O_3$, $ZrO_2$ and $HfO_2$. Two of these dielectric materials are selected in consideration of their refractive indexes with respect to the laser beam emitted, and then are alternatively deposited several times to form the reflective layer.

On the other hand, in a laser diode according to the present invention, the reflective layer 35 is formed of one dielectric material and air rather than two different dielectric materials. That is, several pairs of an air layer 33 and a dielectric layer 34 form the reflective layer 35 together. Here, the refractive index of air is 1, and therefore is lower than any other dielectric material.

Figure 4A:
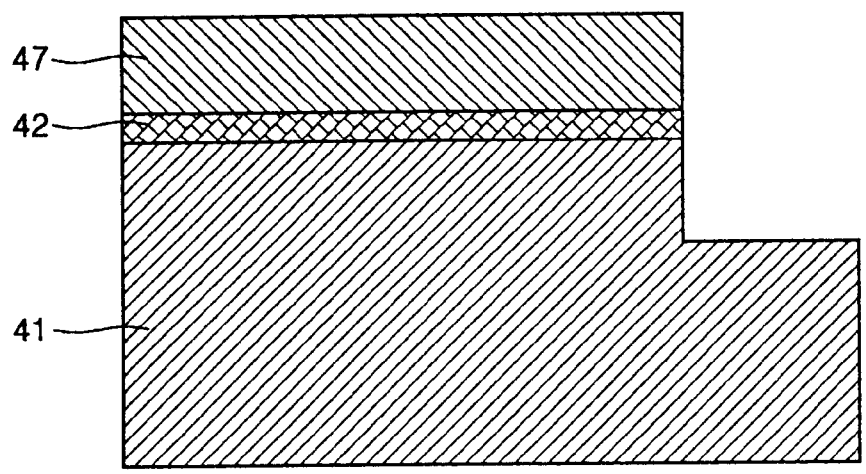
FIGS. 4A through 4D are views for explaining a method for fabricating a reflective layer of a laser diode according to the present invention.

Referring to FIGS. 4A through 4D, a method for fabricating a laser diode that uses a reflective layer including an air layer, according to the present invention, will now be described in detail. First, as shown in FIG. 4A, a laser oscillating layer 42, which is made of a lower clad layer, an active layer and an upper clad layer, is formed on a substrate 41. Then, an upper electrode 47 is deposited on the laser oscillating layer 42.

Figure 4B:
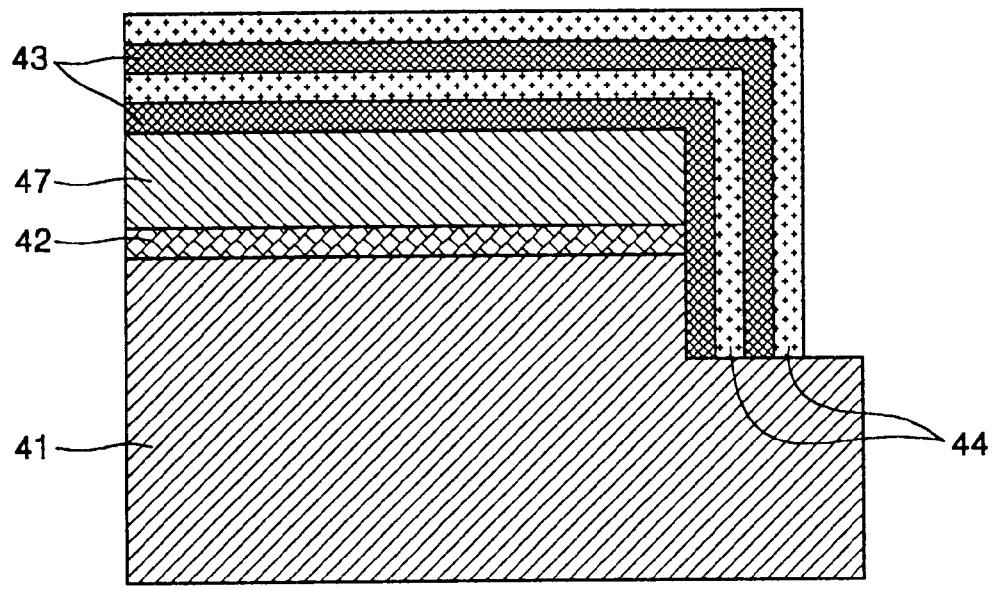
Figure 4C:
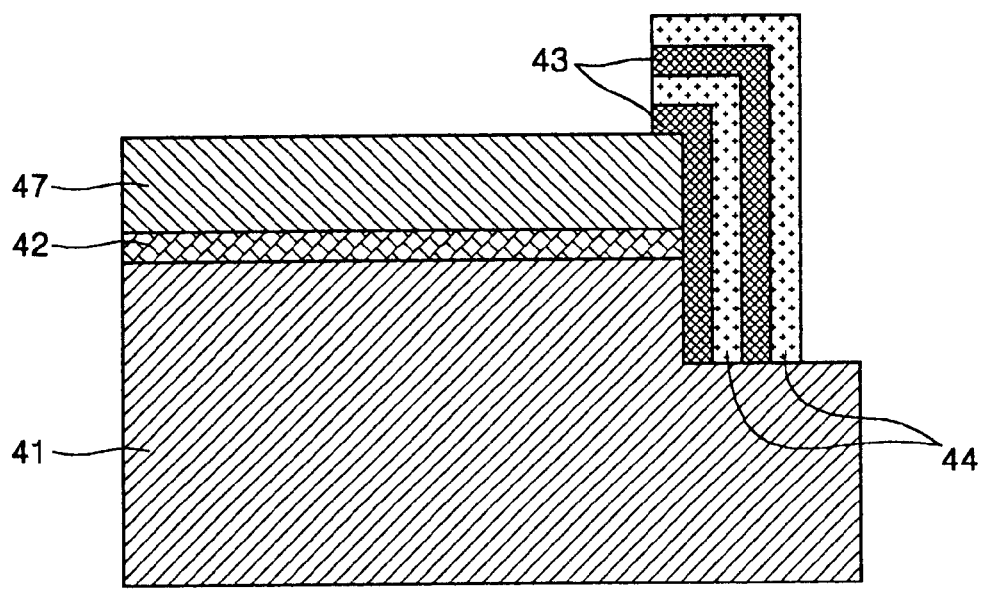

Next, as shown in FIG. 4B, a sacrificial layer 43 is formed of a material that can be selectively etched by sputtering, on the resultant structure of the substrate 41. Thereafter, a dielectric material with a high refractive index is deposited to form a dielectric layer 44 on the sacrificial layer 43. Then, the sacrificial layer 43 and the dielectric layer 44 are alternately formed several times to form several pairs. Here, the points on which the sacrificial layers 43 are deposited are the places where air layers 45 are to be formed during the subsequent process. The thicknesses of the sacrificial layer 43 and the dielectric layer 44 are calculated by the formula $\lambda/(4n)$. Here, $\lambda$ denotes the wavelength of the laser beam emitted from the laser oscillating layer 42, and n denotes the refractive index of air and the dielectric layer 44 with respect to the wavelength of the laser beam emitted. Since the refractive index of air is 1, the thickness of each point where the air layers 45 is calculated by $\lambda/4$.

Here, the number of pairs of the sacrificial layer 43 and the dielectric layer 44 varies according to the refractive index of the dielectric material of the dielectric layer 44. For instance, if the dielectric layer 44 is formed of $TiO_2$, the difference between its refractive index and the refractive index of air is 1.83 with respect to a laser beam wavelength of 410 nm. Therefore, two pairs of the sacrificial layer 43 and the dielectric layer 44 are sufficient to obtain a reflectance of more than 95% as shown in FIG. 4B.

Then, predetermined portions of the sacrificial layers 43 and the dielectric layers 44, which are non-conductive layers, are removed to connect the upper electrode 47 to an outside power source. Preferably, in the case of an edge emitting laser diode according to the present invention, a reflective layer 46 that is composed of pairs of the dielectric layer 44 and the air layer 45 is formed at one side of the laser oscillating layer 42. However, thin layers such as the sacrificial layers 43 and the dielectric layers 44 may be formed on the upper electrode 47 during the deposition of these layers. Preferably, these thin layers are removed by reactive ion etching (RIE).

Figure 4D:
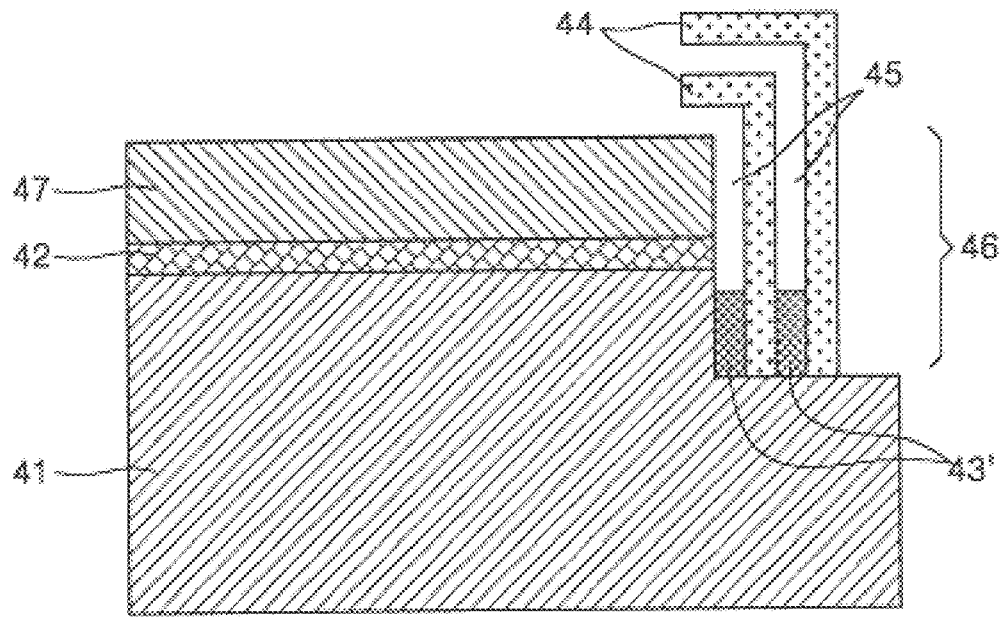

Next, the sacrificial layers 43 are selectively removed from one side of each of the laser oscillating layer 42 by wet etching. As a result, the portions from which the sacrificial layers 43 are removed are filled with air as shown in FIG. 4D, thereby being the air layers 45. Thus, at one side of each of the laser oscillating layer 42 and the upper electrode 47, the air layers 45 and the dielectric layers 44 are alternately deposited several times to form several pairs, thus being the reflective layer 46. Even if the sacrificial layers 43 are not completely removed, i.e., remnant sacrificial layers 43' are present, a laser diode according to the present invention can operate normally if the air layers 45, rather than the sacrificial layers 43, are formed at one side of the laser oscillating layer 42. However, the remnant sacrificial layers 43' must not be in the line of the laser beam emitted from the laser oscillating layer 42.

Figure 5A:
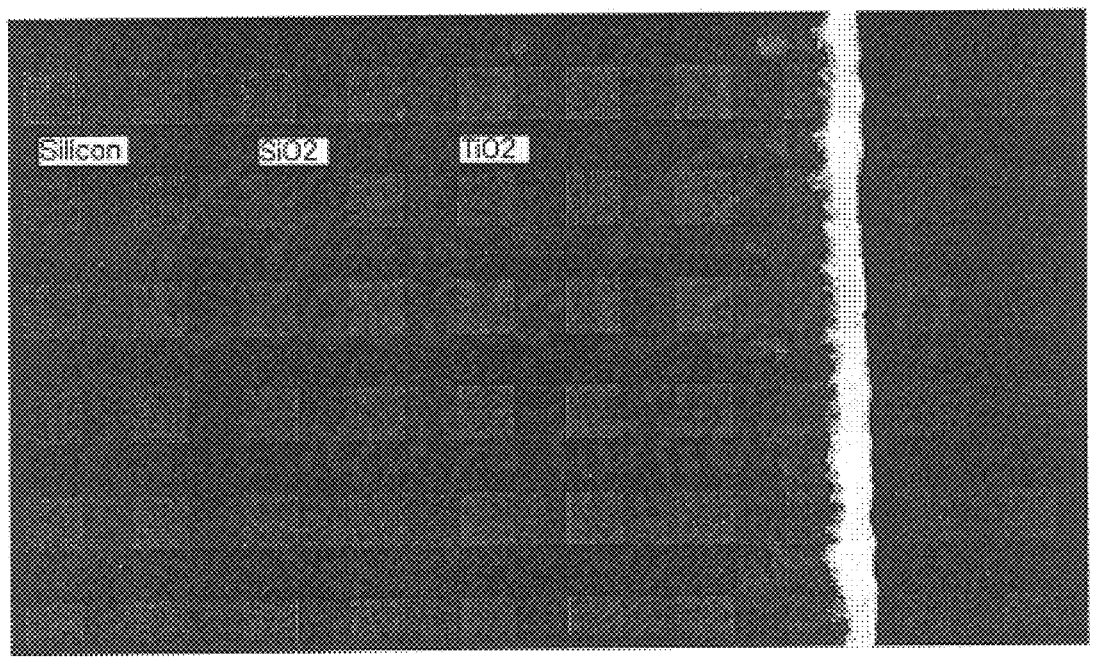
FIGS. 5A and 5B are photographs of a reflective layer of a laser diode according to the present invention, taken by a scanning electron microscope (SEM). In detail.
Figure 5B:
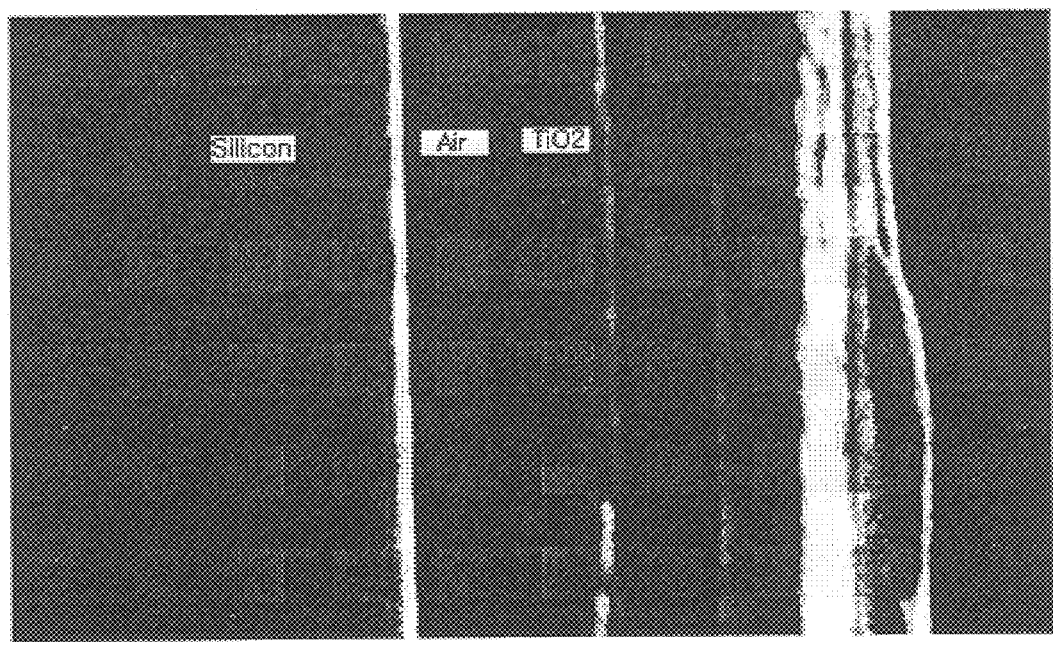

FIGS. 5A and 5B are photographs of a reflective layer of a laser diode according to the present invention, taken by a scanning electron microscope (SEM). In detail, FIG. 5A is an SEM photograph of the laser diode having sacrificial layers ($SiO_2$) and dielectric layers ($TiO_2$) at one side of a substrate and a laser oscillating layer, and FIG. 5B is an SEM photograph of the laser diode in which the sacrificial layers are removed by selective etching.

From FIG. 5B, it is noted that the reflective layer has a structure in which an air layer, a dielectric layer, an air layer, and a dielectric layer are sequentially deposited at one side of the substrate and the laser oscillating layer as shown in FIG. 4D.

Figure 6:
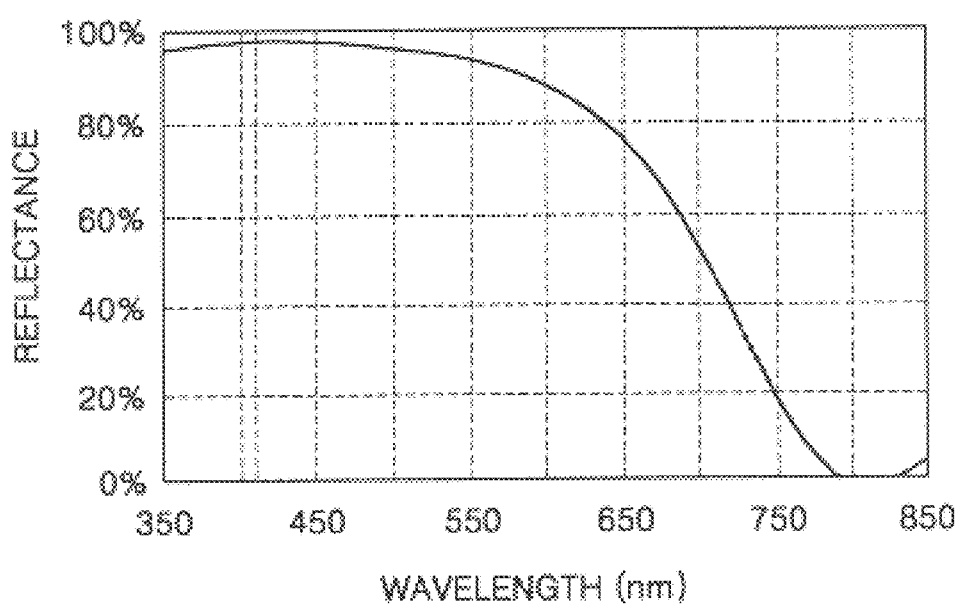
FIG. 6 is a graph showing the reflectance of a reflective layer with respect to the wavelength of a laser beam emitted from a laser oscillating layer in a laser diode according to the present invention.

FIG. 6 is a graph showing the reflectance of the wavelength of the laser beam emitted from a laser diode, according to the present invention, including a reflective layer that has air layers. Here, the reflective layer is formed by alternately depositing an air layer and a $TiO_2$ layer two times, i.e., two pairs.

For instance, an $SiO_2$ layer and a $TiO_2$ layer are sequentially formed. Then, an $SiO_2$ layer and a $TiO_2$ layer are sequentially formed once more to form two pairs of the $SiO_2$ layers and the $TiO_2$ layers. Here, with respect to a laser beam wavelength of 410 nm, the $SiO_2$ layer is formed to a thickness of 103 nm in consideration of the refractive index of air, i.e., 1, because it will be selectively etched during the subsequent process, and then, the $TiO_2$ layer is formed to a thickness of 37 nm because its refractive index is 2.83.

After removal of the reflective layer from the upper electrode, the remnant reflective layer, which is formed at one side of the laser oscillating layer, may be selectively etched using a buffered oxide etchant, e.g., diluted hydro fluorine acid, to remove the $SiO_2$ layers. Thus, the resulting reflective layer has a structure in which an air layer, a $TiO_2$ layer, an air layer and a $TiO_2$ layer are sequentially stacked. Then, with respect to various laser beam wavelengths, the reflectance of the reflective layer is measured, and the results show that the reflective layer has a reflectance of more than 90% for the wavelengths below 550 nm. In particular, the reflectance of the reflective layer is 97% at the wavelength of 410 nm. That is, the reflective layer has higher reflectance for a wider range of wavelengths than conventional reflective layers, and further, a laser diode according to the present invention can be stable irrespective of a wavelength variation, due to the reflective layer.

While the present invention has been particularly shown and described with reference to preferred embodiments thereof, it will be understood by those skilled in the art that various changes in form and details may be made therein without departing from the spirit and scope of the invention as defined by the appended claims.

In a reflective layer of a laser diode according to the present invention, the one of two different dielectric layers used in conventional laser diodes that has the lower refractive index is replaced with an air layer. Accordingly, it is possible to form a reflective layer having a higher reflectance with a reduced number of pairs of dielectric layers and air layers, thereby making a laser diode whose threshold voltage is reduced and which can produce a high-output laser beam.

What is claimed is:
1. A laser diode comprising:
a substrate;
a laser oscillating layer formed on the substrate;
an upper electrode formed on the laser oscillating layer; and
a reflective layer formed at one side of the laser oscillating layer,
wherein the reflective layer comprises air layers.
2. The laser diode of claim 1, wherein the reflective layer has a structure in which an air layer and a dielectric layer are alternately deposited several times.
3. The laser diode of claim 2, wherein the reflective layer is made of at least two pairs of an air layer and a dielectric layer.
4. The laser diode of claim 2, wherein the dielectric layers comprise a $TiO_2$ layer.

* * * * *